(12) United States Patent
Sato et al.

(10) Patent No.: US 11,079,815 B2
(45) Date of Patent: Aug. 3, 2021

(54) COOLING DEVICE AND INFORMATION PROCESSING APPARATUS

(71) Applicant: FUJITSU LIMITED, Kawasaki (JP)

(72) Inventors: Yoichi Sato, Kawasaki (JP); Kengo Ueda, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 402 days.

(21) Appl. No.: 15/299,712

(22) Filed: Oct. 21, 2016

(65) Prior Publication Data

US 2017/0131750 A1 May 11, 2017

(30) Foreign Application Priority Data

Nov. 10, 2015 (JP) .............................. JP2015-220665

(51) Int. Cl.
  *G06F 1/20* (2006.01)
  *G06F 1/18* (2006.01)
  *H05K 7/20* (2006.01)

(52) U.S. Cl.
  CPC ................ *G06F 1/20* (2013.01); *G06F 1/181* (2013.01); *H05K 7/20145* (2013.01)

(58) Field of Classification Search
  CPC ........... H05K 7/20145; H05K 7/20136; H05K 7/20172; G06F 1/20; G06F 1/181
  See application file for complete search history.

(56) References Cited

U.S. PATENT DOCUMENTS

| 5,572,403 A | * | 11/1996 | Mills | ........................ | G06F 1/20 |
| | | | | | 165/104.34 |
| 5,793,608 A | * | 8/1998 | Winick | ..................... | G06F 1/20 |
| | | | | | 257/E23.099 |
| 5,963,424 A | * | 10/1999 | Hileman | ................. | G06F 1/206 |
| | | | | | 361/679.48 |
| 6,473,297 B1 | * | 10/2002 | Behl | ....................... | G06F 1/184 |
| | | | | | 361/679.33 |

(Continued)

FOREIGN PATENT DOCUMENTS

| JP | 5-335766 | 12/1993 |
| JP | 2002-237178 | 8/2002 |

(Continued)

OTHER PUBLICATIONS

Miyoshi, JP 05-335766 A English machine translation, Dec. 27, 1993 (Year: 1993).*

(Continued)

*Primary Examiner* — Kenneth J Hansen
*Assistant Examiner* — Phillip Decker
(74) *Attorney, Agent, or Firm* — Fujitsu Patent Center

(57) ABSTRACT

A cooling device includes a device case that is arranged in an enclosure having a midplane, with a case front face facing the midplane. The device case includes a first fan unit for generating a flow of air from a side with the case front face to a side with a case rear face of the device case and a second fan unit, being stored at closer position to the side with the case front face than the first fan unit, for taking in part of air passing through one side in a width direction of the device (Continued)

case and flowing to the first fan unit and sending out the part of the air to the other side in the width direction of the device case. The air flow by the second fan unit can effectively cool circuitries at the rear side of the midplane.

19 Claims, 16 Drawing Sheets

(56) References Cited

U.S. PATENT DOCUMENTS

| | | | | |
|---|---|---|---|---|
| 6,925,246 B1* | 8/2005 | Behl | ................... | G11B 33/126 |
| | | | | 348/E5.128 |
| 7,436,665 B2* | 10/2008 | Chen | ................... | G06F 1/20 |
| | | | | 361/679.48 |
| 7,593,225 B2* | 9/2009 | Sasagawa | ............... | G06F 1/187 |
| | | | | 165/104.33 |
| 7,826,222 B2* | 11/2010 | Aybay | ............... | H05K 7/20563 |
| | | | | 361/695 |
| 8,064,200 B1* | 11/2011 | West | ................... | H05K 7/20563 |
| | | | | 361/695 |
| 8,125,779 B2* | 2/2012 | Aybay | ............... | H05K 7/20563 |
| | | | | 361/694 |
| 8,335,082 B2* | 12/2012 | Sun | ................... | G06F 1/20 |
| | | | | 361/679.49 |
| 8,854,814 B2* | 10/2014 | Liu | ................... | H05K 7/20736 |
| | | | | 361/695 |
| 9,215,831 B2* | 12/2015 | Hao | ................... | H05K 7/20572 |
| 9,894,799 B2* | 2/2018 | Oota | ................... | H05K 7/20563 |
| 10,019,045 B2* | 7/2018 | Kruse | ................ | H05K 7/20145 |
| 10,372,177 B2* | 8/2019 | Kurosaki | ................. | G06F 1/20 |
| 2007/0081888 A1* | 4/2007 | Harrison | ............... | F04D 19/007 |
| | | | | 415/47 |
| 2008/0239656 A1* | 10/2008 | Sasagawa | ............... | G06F 1/187 |
| | | | | 361/679.37 |
| 2011/0205705 A1* | 8/2011 | Graybill | ............. | H05K 7/20745 |
| | | | | 361/696 |
| 2013/0044430 A1* | 2/2013 | Carl, Jr. | ............. | H05K 7/20772 |
| | | | | 361/695 |
| 2013/0148298 A1* | 6/2013 | Liu | ................... | H05K 7/20145 |
| | | | | 361/695 |
| 2014/0362529 A1 | 12/2014 | Tsuchida | | |
| 2015/0153792 A1* | 6/2015 | Chen | ................... | G06F 1/20 |
| | | | | 361/679.47 |

FOREIGN PATENT DOCUMENTS

| | | | | |
|---|---|---|---|---|
| JP | 2008-251067 A | | 10/2008 | |
| JP | 2014-239167 | | 12/2014 | |
| WO | WO-2008041737 A1 * | 4/2008 | ............. | G06F 1/203 |

OTHER PUBLICATIONS

PCI Industrial Computers Manufacturers Group, PICMG 3.0 Short Form Specification, Jan. 2003, p. 22 (Year: 2003).*
JPOA—Office Action of Japanese Patent Application No. 2015-220665 dated May 28, 2019 with Full Machine Translation.

* cited by examiner

COOLING DEVICE AND INFORMATION PROCESSING APPARATUS

CROSS-REFERENCE TO RELATED APPLICATION

This application is based upon and claims the benefit of priority of the prior Japanese Patent Application No. 2015-220665, filed on Nov. 10, 2015, the entire contents of which are incorporated herein by reference.

FIELD

The embodiments discussed herein are related to a cooling device and an information processing apparatus.

BACKGROUND

There is electronic equipment including an enclosure having an intake port on a front face side and an exhaust port on a rear face side, a midplane provided in the enclosure, and a cooling device arranged on a rear face side of the midplane (for example, Japanese Laid-open Patent Publication No. 2008-251067). In this type of electronic equipment, when a cooling fan is activated, cooling air is introduced into an enclosure through an intake port. The cooling air introduced into the enclosure cools a midplane and units connected to the midplane, and then, is exhausted through an exhaust port of the enclosure.

Cooling air introduced into the enclosure through the intake port, however, passes through two sides in a width direction of the midplane and is exhausted to outside the enclosure through the exhaust port of the enclosure. Thus, cooling air is unlikely to flow on a rear face side of the midplane, which may reduce cooling efficiency on the rear face side of the midplane, namely, on an exhaust port side of the enclosure with respect to the midplane.

The technique disclosed herein enhances cooling efficiency on an exhaust port side of an enclosure with respect to a midplane.

SUMMARY

According to an aspect of the invention, a cooling device includes a device case that is arranged in an enclosure having a midplane, with a case front face facing the midplane. The device case includes a first fan unit for generating a flow of air from a side with the case front face to a side with a case rear face of the device case and a second fan unit, being stored at closer position to the side with the case front face than the first fan unit, for taking in part of air passing through one side in a width direction of the device case and flowing to the first fan unit and sending out the part of the air to the other side in the width direction of the device case. The air flow by the second fan unit can effectively cool circuitries at the rear side of the midplane.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

A first embodiment of the technique disclosed herein will be described.

(Information Processing Apparatus)

Figure 1:
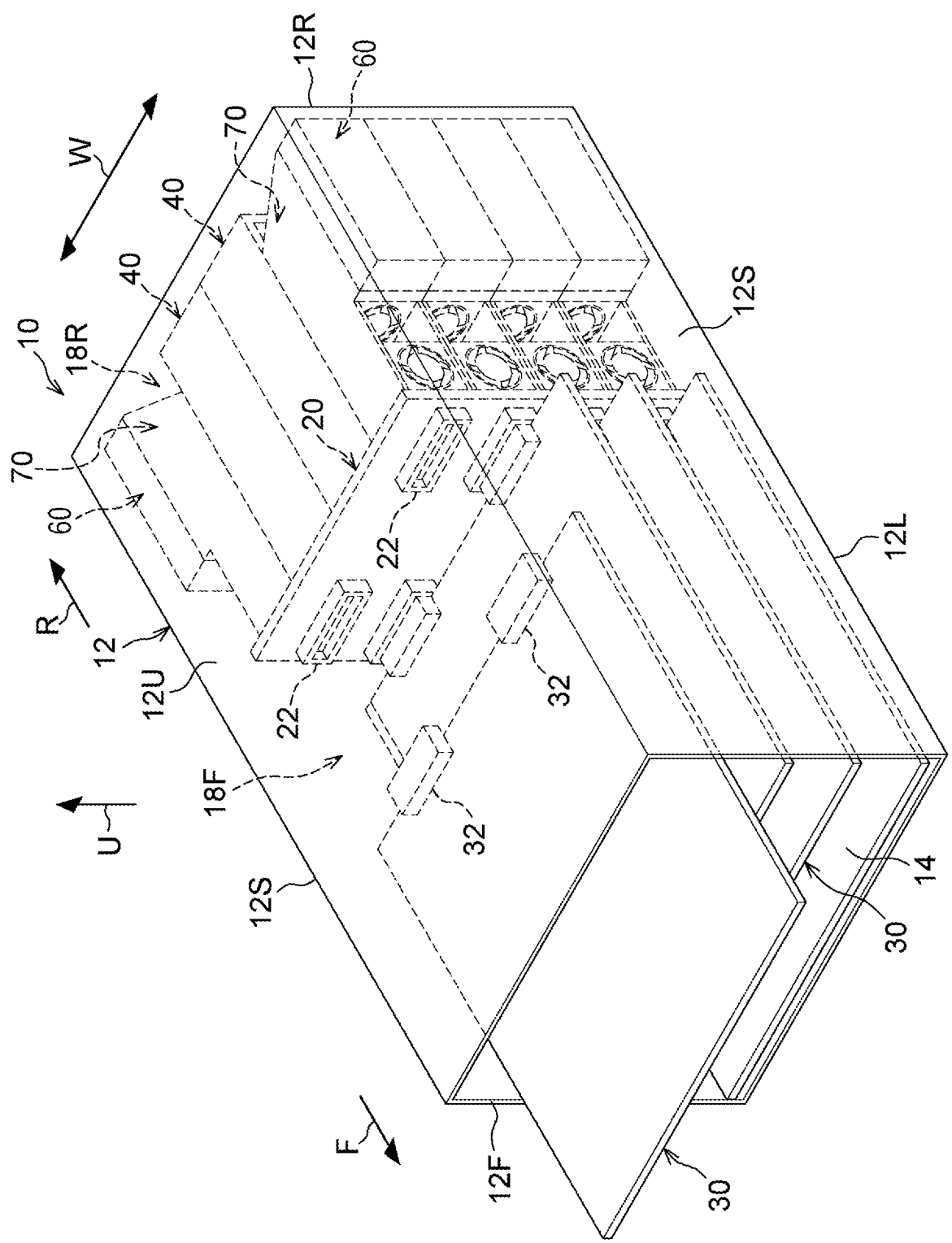
FIG. 1 is a perspective view of an information processing apparatus according to a first embodiment as viewed from a front side.

As illustrated in FIG. 1, an information processing apparatus 10 according to a first embodiment is a midplane type information processing apparatus. Intake-side units 30 and exhaust-side units are stored on two respective sides of a midplane 20 in an enclosure 12. More specifically, the information processing apparatus 10 includes the enclosure 12, the midplane 20, a plurality of intake-side units 30, middle units 40 and outer units 60 as a plurality of exhaust-side units, and a plurality of cooling devices 70.

Note that an arrow F appropriately illustrated in the drawings indicates a front side in a longitudinal direction (or front-rear direction) of the enclosure 12 while an arrow R indicates a rear side in the longitudinal direction of the enclosure 12. An arrow W indicates a width direction of the enclosure 12. An arrow U indicates an upper side in a height direction of the enclosure 12. Arrows V, V1, V2, V3, and V4 indicate flows of cooling air in the enclosure 12.

The enclosure 12 is formed in the shape of a box which is open on two sides in the longitudinal direction. The enclosure 12 includes a top wall portion 12U and a bottom wall portion 12L facing each other in the height direction (a direction indicated by the arrow U) of the enclosure 12, and one pair of side wall portions 12S facing each other in the width direction (a direction indicated by the arrow W) of the enclosure 12.

An enclosure intake port 14 is formed in a front face 12F on the front side in the longitudinal direction of the enclosure 12. The enclosure intake port 14 also functions as a storage port for storing the plurality of intake-side units 30 in the enclosure 12. Note that the front side in the longitudinal direction of the enclosure 12 is an example of one side in the longitudinal direction of the enclosure 12.

Figure 2:
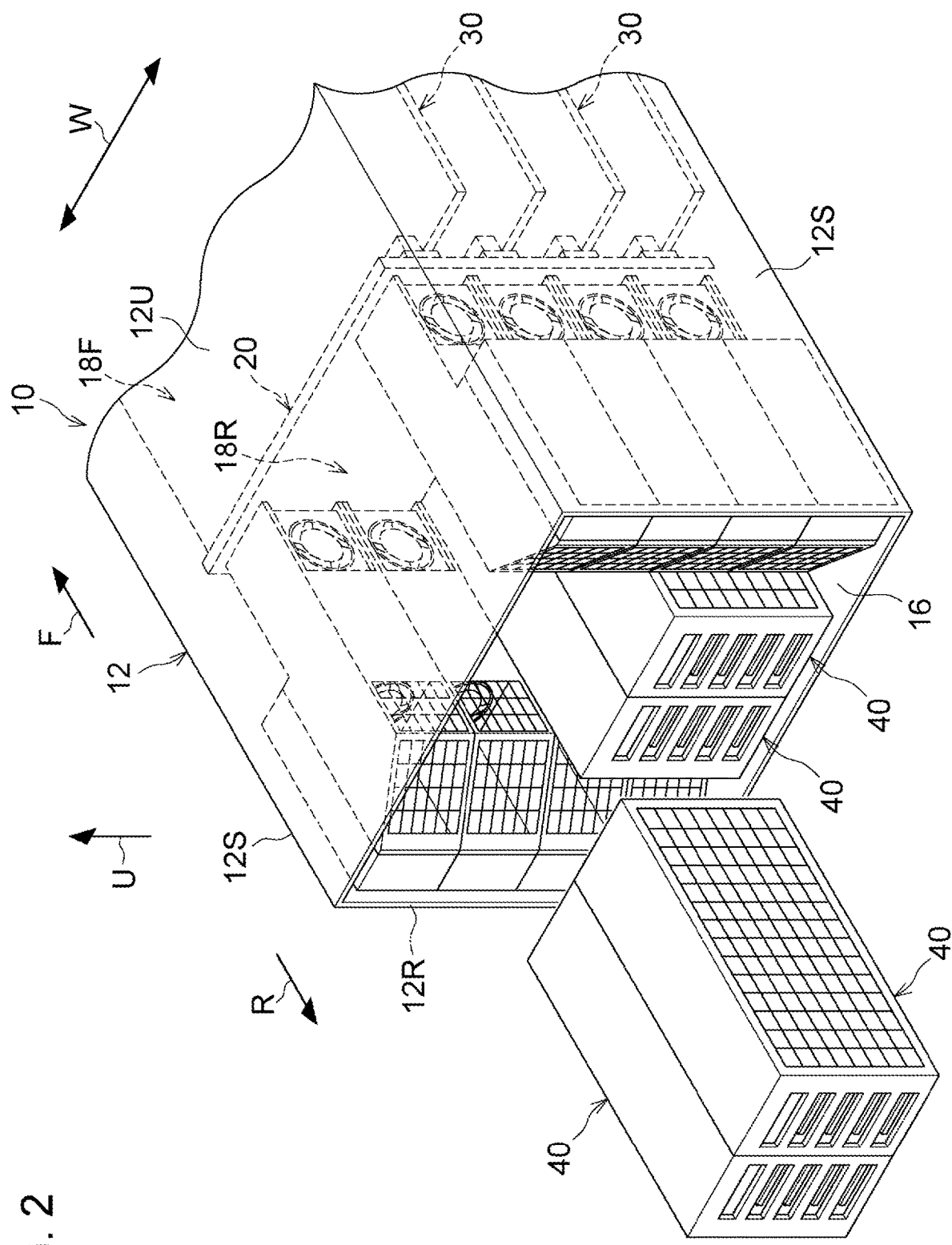
FIG. 2 is a perspective view of the information processing apparatus illustrated in FIG. 1 as viewed from a rear side.

Meanwhile, as illustrated in FIG. 2, an enclosure exhaust port 16 is formed in a rear face 12R on the rear side in the longitudinal direction of the enclosure 12. The enclosure exhaust port 16 also functions as a storage port for storing the plurality of exhaust-side units in the enclosure 12.

Figure 3:
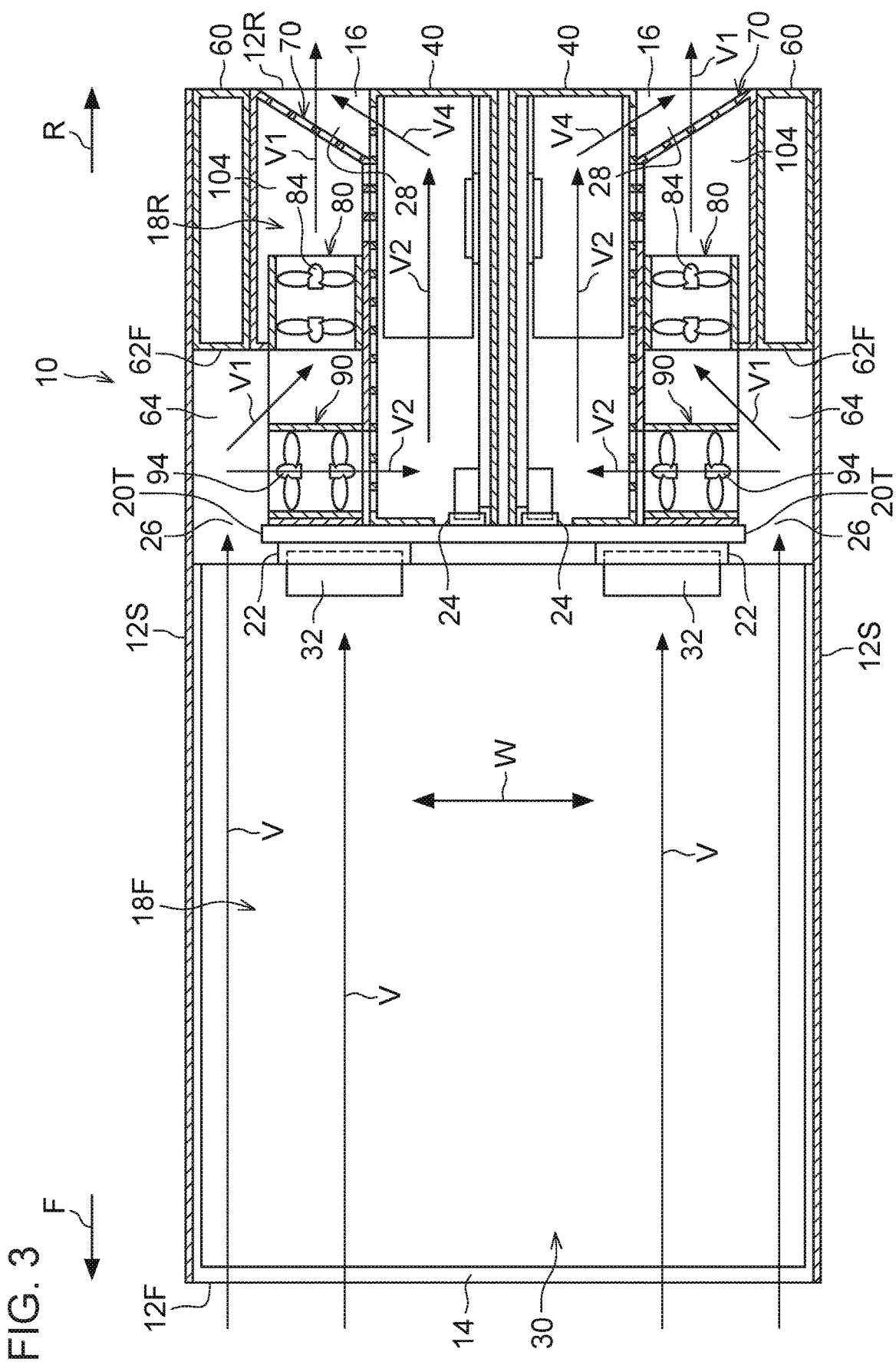
FIG. 3 is a plan sectional view of the information processing apparatus illustrated in FIG. 1.

As illustrated in FIG. 3, the midplane 20 is provided in an intermediate portion in the longitudinal direction in the enclosure 12. The midplane 20 is a printed circuit board having various intake-side connectors 22 and various exhaust-side connectors 24 mounted on two faces. The midplane 20 is stored in an upright position in the enclosure 12. In other words, the midplane 20 is stored in the enclosure 12 with a thickness direction set to the longitudinal direction of the enclosure 12.

As illustrated in FIG. 3, the midplane 20 divides the enclosure 12 into an intake-side storage chamber 18F on the enclosure intake port 14 side and an exhaust-side storage chamber 18R on the enclosure exhaust port 16 side. A width (a length in the direction of the arrow W) of the midplane 20 is set to be smaller than a width (a length in the direction of the arrow W) of the enclosure 12. With this configuration, respective ventilation flues 26 are formed between end portions 20T on two sides in a width direction of the midplane 20 and the one pair of side wall portions 12S of the enclosure 12. The ventilation flues 26 connect the intake-side storage chamber 18F and the exhaust-side storage chamber 18R (causes the intake-side storage chamber 18F and the exhaust-side storage chamber 18R to communicate).

(Intake-Side Unit)

The plurality of intake-side units 30 is stored in the intake-side storage chamber 18F. Each intake-side unit 30 is, for example, a printed circuit board on which a plurality of electronic components, such as a CPU and a memory, are mounted. The intake-side units 30 each have a thickness direction set to the height direction of the enclosure 12 and are stored in the intake-side storage chamber 18F through the enclosure intake port 14 as the storage port. Connectors 32 are mounted to an end portion of each intake-side unit 30. The connectors 32 are electrically connected to the intake-side connectors 22 mounted on a face (hereinafter referred to as a "front face") 20F on the enclosure intake port 14 side of the midplane 20.

(Exhaust-Side Unit)

Figure 4:
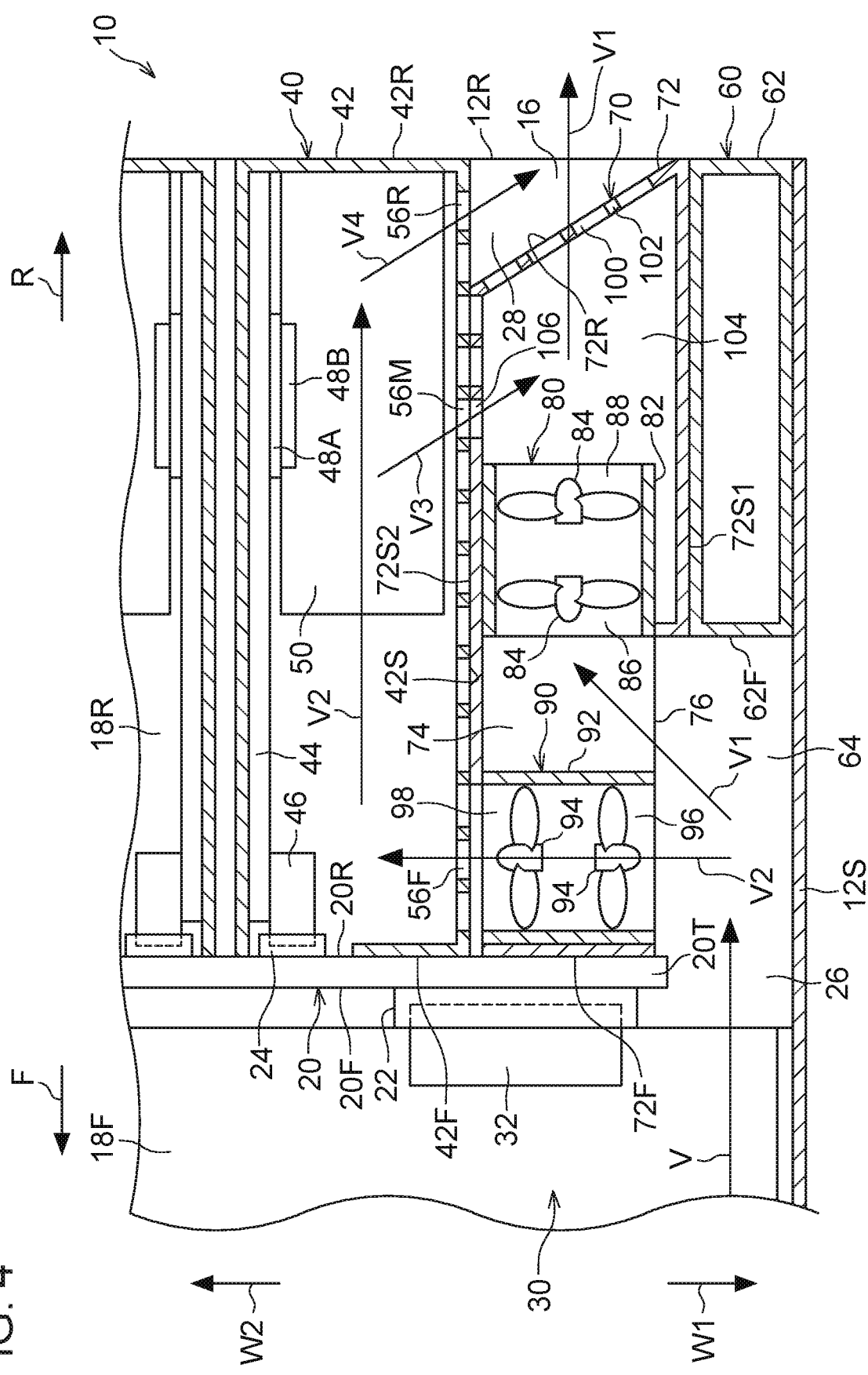
FIG. 4 is a partial enlarged view of FIG. 3.

As illustrated in FIGS. 3 and 4, the plurality of exhaust-side units is stored in the exhaust-side storage chamber 18R through the enclosure exhaust port 16 as the storage port. In the present embodiment, the exhaust-side units include a plurality of middle units 40 which are stored on a middle side (on a center line CL side) in a width direction of the exhaust-side storage chamber 18R and the outer units 60 that are stored on outer sides in the width direction of the exhaust-side storage chamber 18R. The middle units 40 are stored in two rows side by side in the width direction of the exhaust-side storage chamber 18R. The outer units 60 are stored on the two sides in the width direction of the exhaust-side storage chamber 18R along the side wall portions 12S of the enclosure 12.

Note that, by way of example, each two middle units 40 lying side by side in the width direction of the enclosure 12 are configured to be symmetric with respect to the middle (the center line CL) in the width direction of the exhaust-side storage chamber 18R in the present embodiment. Similarly, the outer units 60 stored on the two sides in the width direction of the exhaust-side storage chamber 18R are configured to be symmetric with respect to the middle (the center line CL) in the width direction of the exhaust-side storage chamber 18R. Hereinafter, an outer side in the width direction (one side in the width direction) of the enclosure 12 will be indicated by an arrow W1, and a middle side in the width direction (the center line CL side or the other side in the width direction) of the enclosure 12 will be indicated by an arrow W2.

Figure 5:
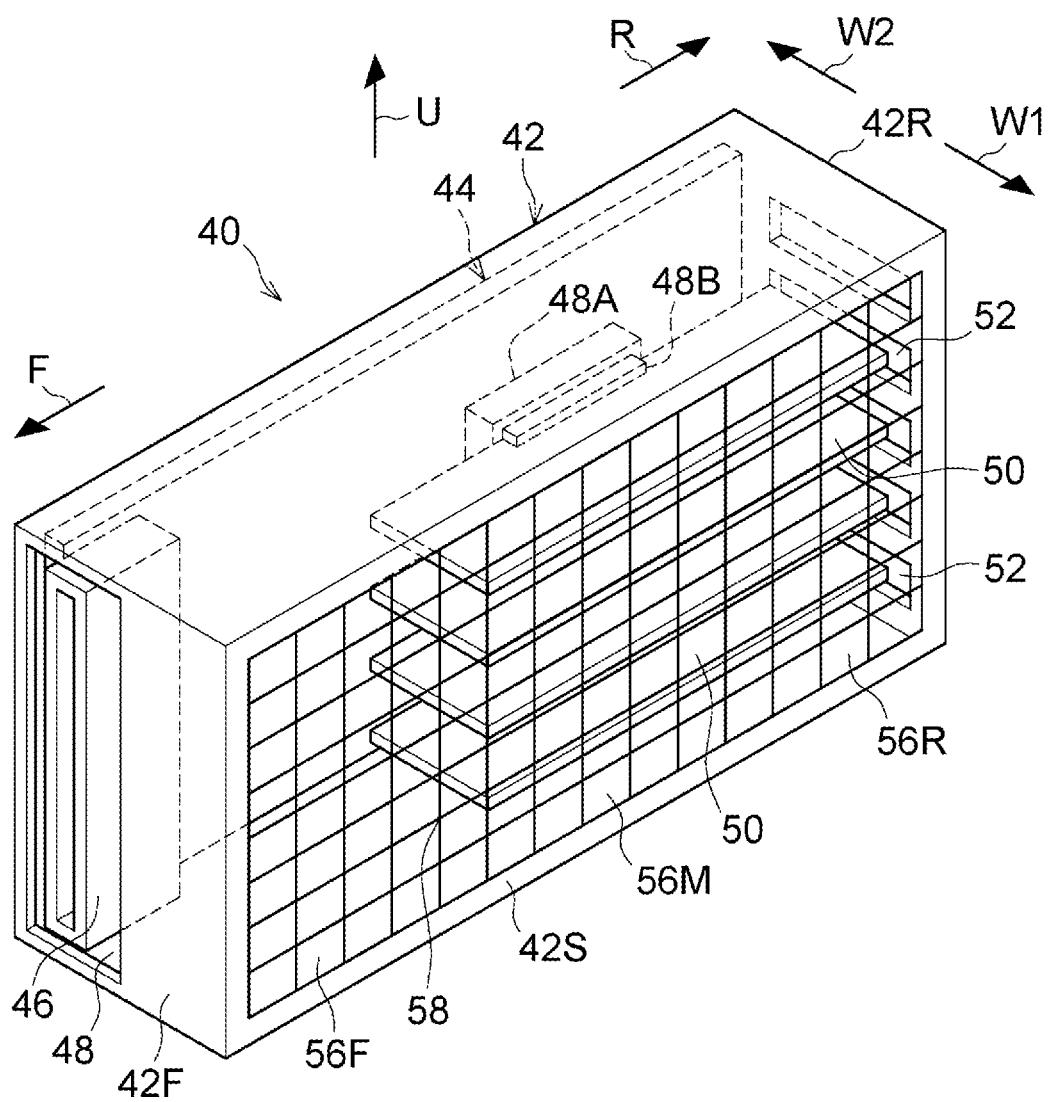
FIG. 5 is a perspective view of a middle unit illustrated in FIG. 4 as viewed from the front side.
Figure 6:
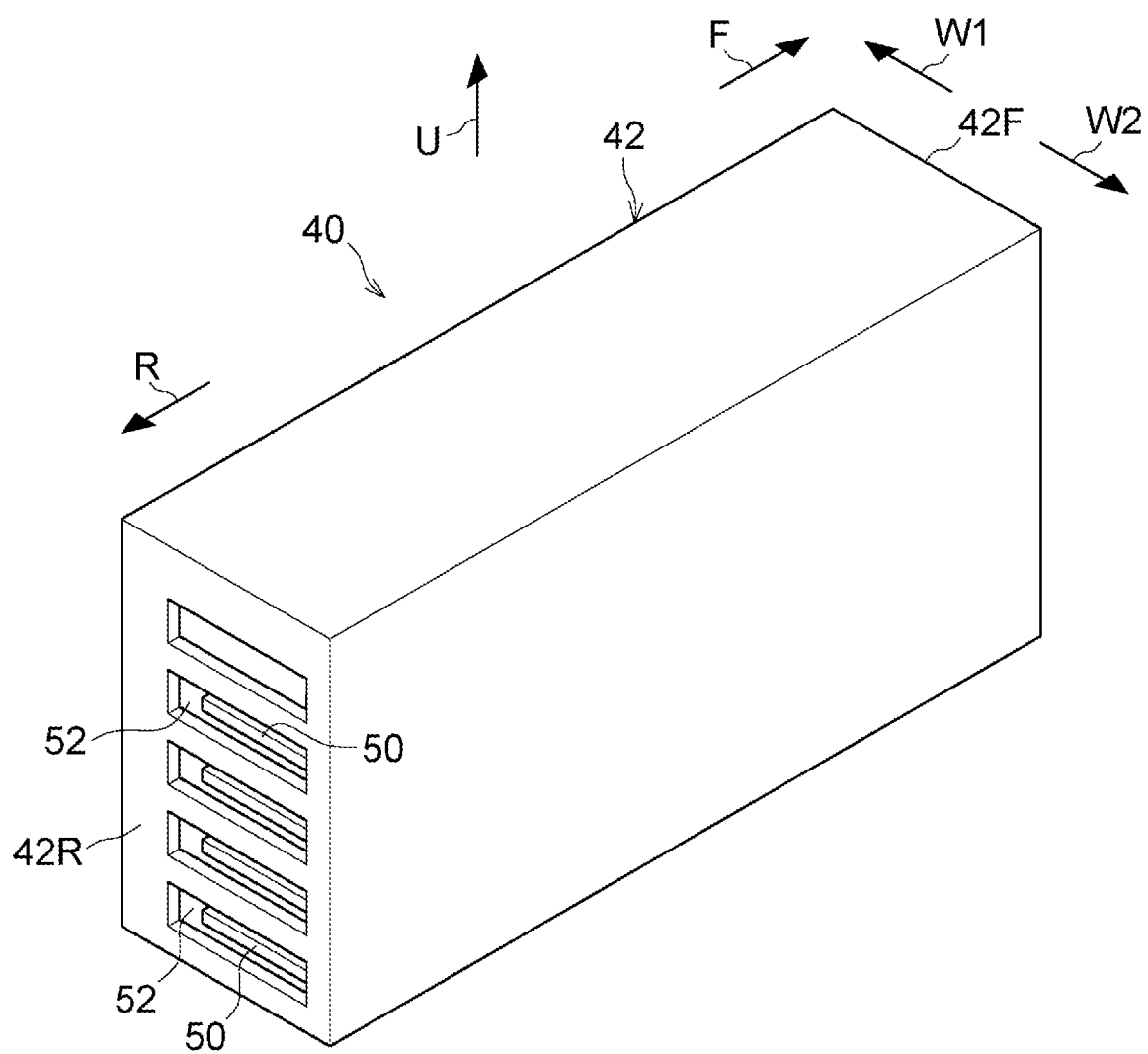
FIG. 6 is a perspective view of the middle unit illustrated in FIG. 5 as viewed from the rear side.
Figure 7:
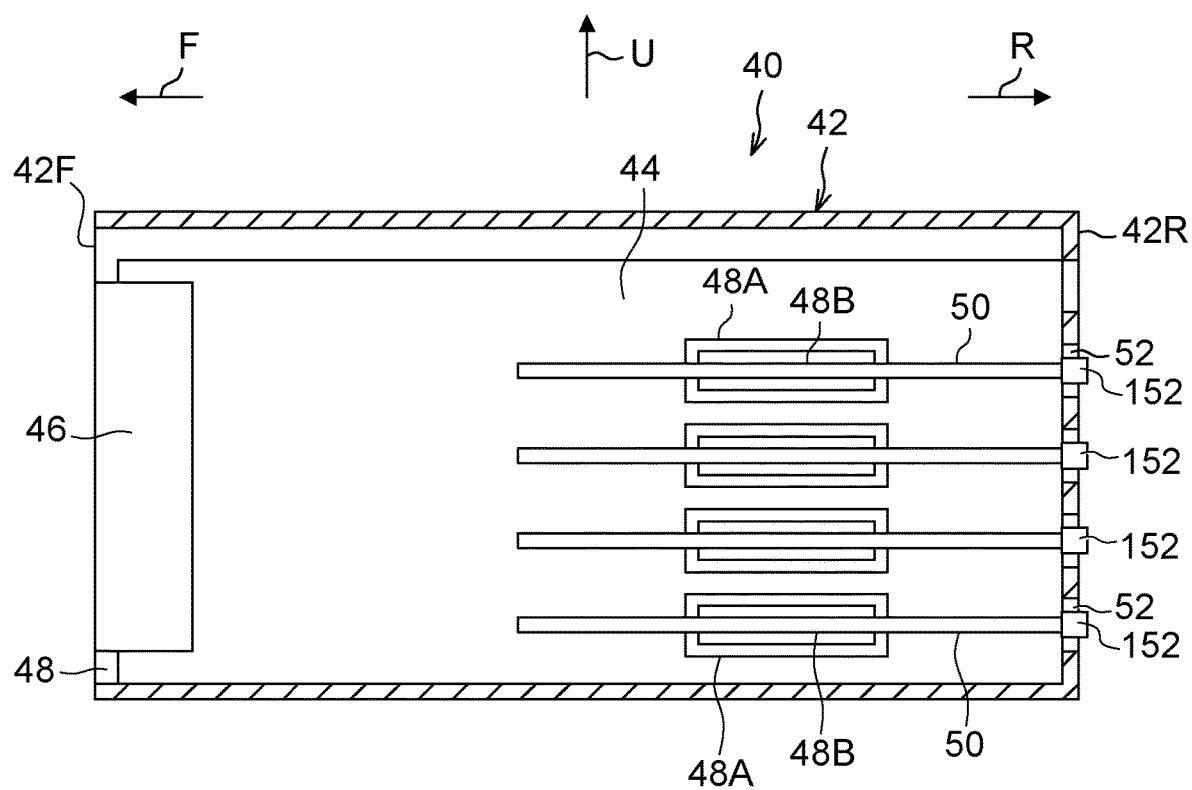
FIG. 7 is a vertical sectional view of the middle unit illustrated in FIG. 5.

As illustrated in FIGS. 5, 6, and 7, the middle unit 40 includes a unit case 42, and a main printed circuit board 44 and a plurality of expansion printed circuit boards 50 which are stored in the unit case 42. The unit case 42 is formed in a box shape. The unit case 42 is stored in the exhaust-side storage chamber 18R while a case front face 42F faces a face (hereinafter referred to as a "rear face") 20R (see FIG. 4) on the enclosure exhaust port 16 side of the midplane 20.

As illustrated in FIG. 5, a front connector opening 48 for exposing a connector 46 mounted on the main printed circuit board 44 is formed in the case front face 42F. The connector 46 is electrically connected to the exhaust-side connector 24 (see FIG. 4) mounted on the rear face 20R of the midplane 20.

The plurality of expansion printed circuit boards 50 are connected to the main printed circuit board 44 via connectors 48A and 48B. A connector 152 (See FIG. 7) is mounted to an end portion of each of the expansion printed circuit boards 50. The connectors are exposed in a plurality of rear connector openings 52 formed in a case rear face 42R of the unit case 42.

Figure 8:
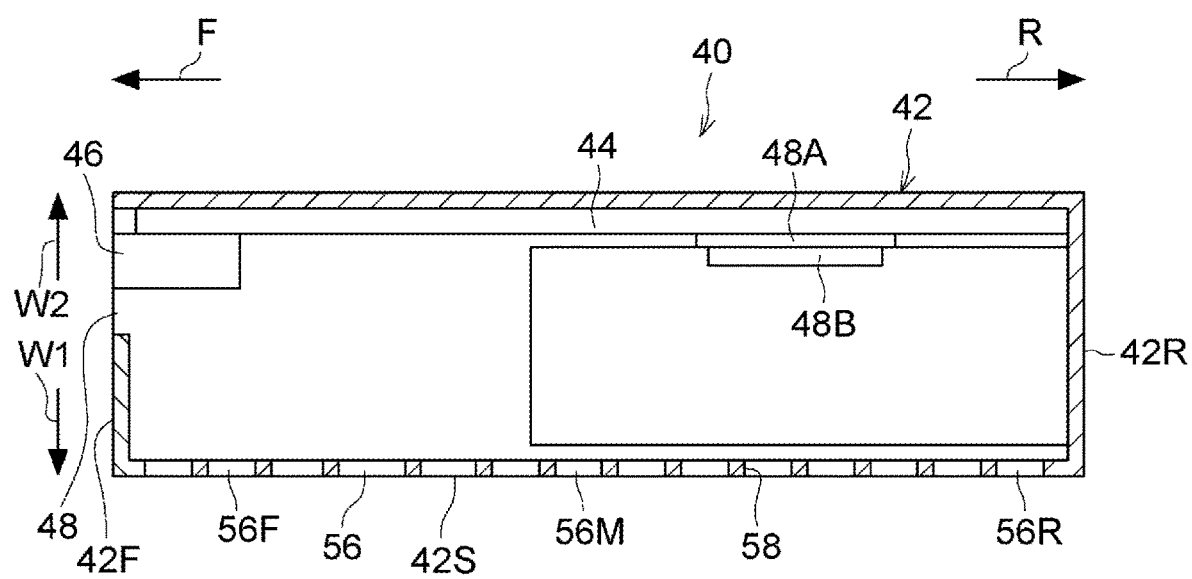
FIG. 8 is a plan sectional view of the middle unit illustrated in FIG. 5.

As illustrated in FIG. 8, case vents 56 are formed in a case side face 42S on an outer side (the arrow W1 side) in a width direction of the unit case 42. A foreign object guard 58 which stops a foreign object or the like from entering into the unit case 42 is provided at the case vents 56. The foreign object guard 58 is, for example, formed in a lattice shape or formed of perforated metal or the like. Note that the case vents 56 on a front side, in an intermediate portion, and on a rear side in a longitudinal direction of the unit case 42 will be referred to hereinafter as case vents 56F, 56M, and 56R, respectively.

As illustrated in FIG. 4, the outer unit 60 is, for example, a power supply unit. The outer unit 60 includes a unit case 62, a transformer (not illustrated) which is stored in the unit case 62, and the like. The outer unit 60 is stored in the exhaust-side storage chamber 18R while a case front face 62F faces the ventilation flue 26.

The case front face 62F of the outer unit 60 is arranged closer to the enclosure exhaust port 16 than a case front face 72F of the cooling device 70 (to be described later). With this configuration, a common duct 64 which introduces air to a first fan unit 80 and a second fan unit 90 of the cooling device 70 (to be described later) is formed between the outer unit 60 and the ventilation flue 26.

(Cooling Device)

Figure 9:
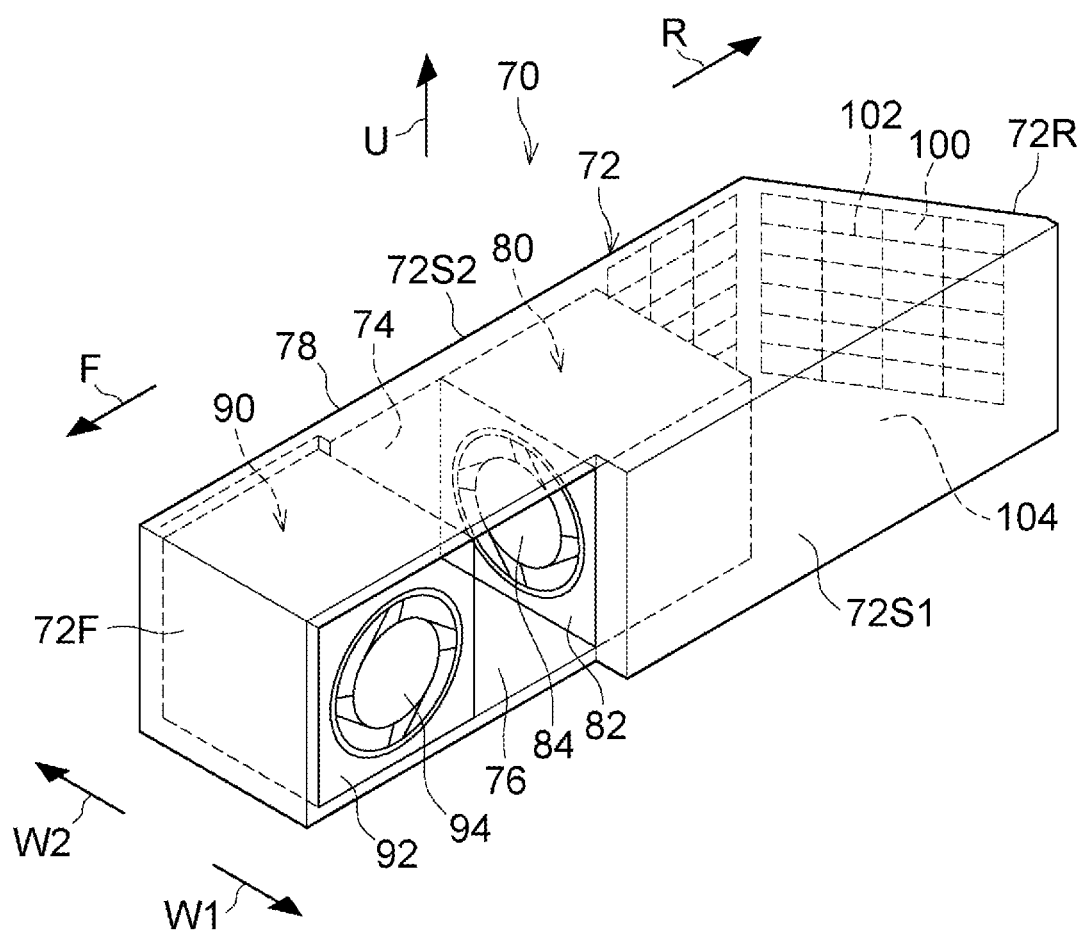
FIG. 9 is a perspective view of a cooling device illustrated in FIG. 4 as viewed from the front side.

As illustrated in FIG. 9, the cooling device 70 includes a device case 72, the first fan unit 80, and the second fan unit 90. The device case 72 is formed in a box shape. The device case 72 is stored on the outer side (the arrow W1 side) in the width direction of the exhaust-side storage chamber 18R while the case front face 72F faces the rear face 20R (see FIG. 4) of the end portion 20T of the midplane 20.

Figure 10:
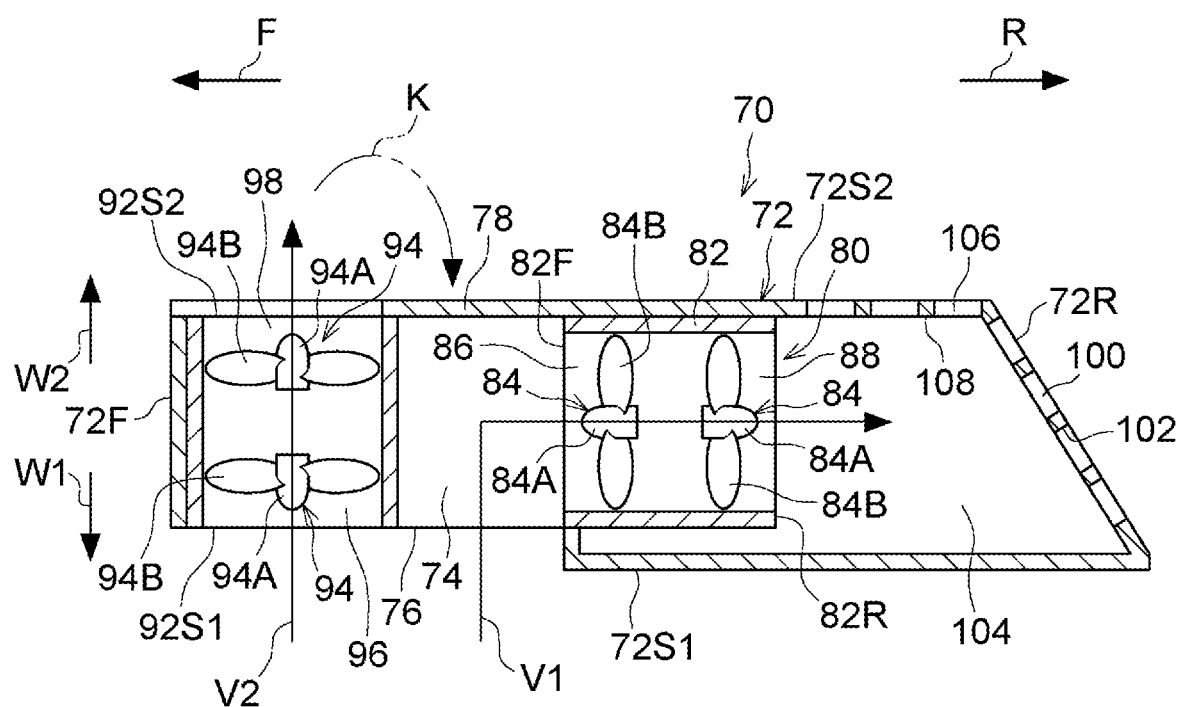
FIG. 10 is a plan sectional view of the cooling device illustrated in FIG. 9.

As illustrated in FIG. 10, the first fan unit 80 is stored in an intermediate portion in a longitudinal direction of the device case 72. The first fan unit 80 includes one pair of first axial fans 84 and a first fan case 82 which stores the one pair of first axial fans 84. Each of the one pair of first axial fans 84 includes a rotating shaft 84A which rotates and a plurality of blades 84B which rotate integrally with the rotating shaft 84A.

Each first axial fan 84 is an axial blower which sucks in air along the rotating shaft 84A and sends out air along the rotating shaft 84A. The one pair of first axial fans 84 has the rotating shafts 84A in the longitudinal direction (directions indicated by the arrows F and R) of the device case 72 and is coaxially arrayed. When the one pair of first axial fans 84 is activated, a flow of air from the case front face 72F toward a case rear face 72R is generated. Note that the first fan unit 80 is capable of storing at least one first axial fan 84.

The first fan case 82 is formed in a hollow box shape which is open on two sides in a longitudinal direction. A first fan intake port 86 which takes air into the first fan case 82 is formed on a case front face 82F side of the first fan case 82. A first fan exhaust port 88 which discharges air in the first fan case 82 to the outside is formed on a case rear face 82R side of the first fan case 82.

The second fan unit 90 is stored on the case front face 72F side of the device case 72. The second fan unit 90 includes one pair of second axial fans 94 and a second fan case 92 which stores the one pair of second axial fans 94. Each of the one pair of second axial fans 94 includes a rotating shaft 94A which rotates and a plurality of blades 94B which rotate integrally with the rotating shaft 94A.

Each second axial fan 94 is an axial blower which sucks in air along the rotating shaft 94A and sends out air along the rotating shaft 94A. The one pair of second axial fans 94 has the rotating shafts 94A in a width direction (the direction of the arrow W) of the device case 72 and is coaxially arranged. That is, the second axial fans 94 and the first axial fans 84 are arranged with axial directions of the rotating shafts 84A shifted by substantially 90 degrees from axial directions of the rotating shafts 94A. When the one pair of second axial fans 94 is activated, part of a flow of air toward the first fan unit 80 through one side (the arrow W1 side) in the width direction of the device case 72 is taken into the second fan unit 90 and is sent out to the other side (the arrow W2 side) in the width direction of the device case 72. Note that the second fan unit 90 is capable of storing at least one second axial fan 94.

The second fan case 92 is formed in a hollow box shape which is open on two sides in a width direction. A second fan intake port 96 which takes air into the second fan case 92 is formed in a case side face 92S1 on one side (the arrow W1 side) in the width direction of the second fan case 92. Meanwhile, a second fan exhaust port 98 which discharges air in the second fan case 92 to the outside is formed in a case side face 92S2 on the other side (the arrow W2 side) in the width direction of the second fan case 92.

The first fan unit 80 and the second fan unit 90 are aligned in the longitudinal direction of the device case 72, and the first fan unit 80 is spaced apart from the second fan unit 90. With this configuration, an intake duct chamber 74 which introduces air to the first fan unit 80 is formed between the first fan unit 80 and the second fan unit 90 in the device case 72.

Figure 11:
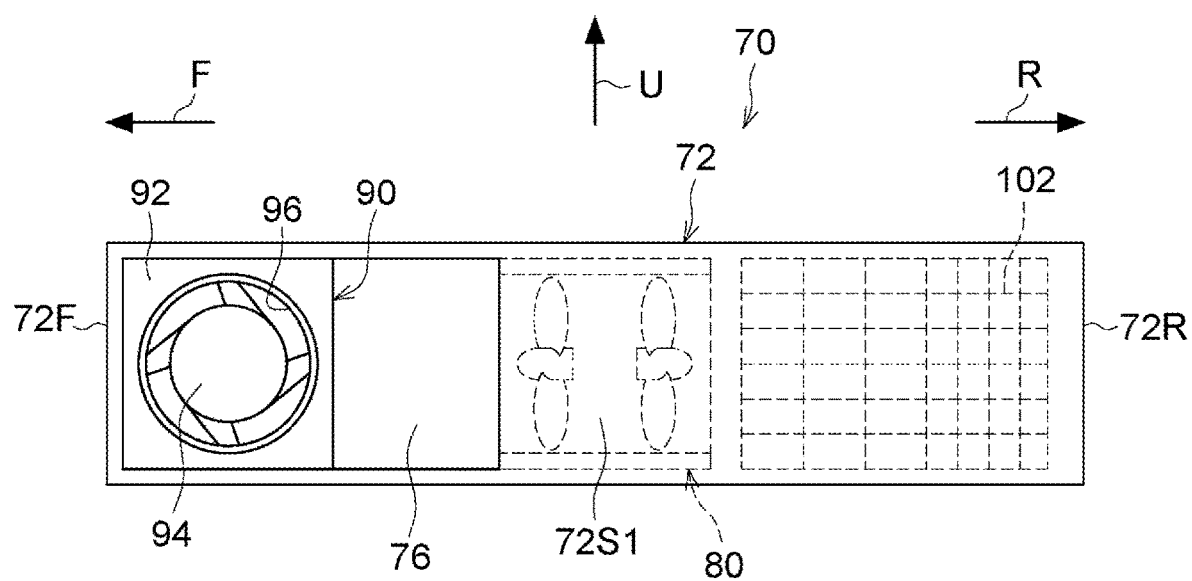
FIG. 11 is a side view of the cooling device illustrated in FIG. 9 as viewed from one side in a width direction.

As illustrated in FIG. 11, a case intake port 76 which introduces air to the first fan unit 80 and the second fan unit 90 is formed in a case side face 72S1 on the one side (the arrow W1 side) in the width direction of the device case 72. The case intake port 76 communicates with the intake duct chamber 74 and exposes the second fan intake port 96 of the second fan unit 90.

Meanwhile, as illustrated in FIG. 10, a partition wall portion 78 which serves as a partition between the first fan intake port 86 of the first fan unit 80 and the second fan exhaust port 98 of the second fan unit 90 is provided on the other side (the arrow W2 side) in the width direction of the device case 72. With the partition wall portion 78, cooling air sent out from the second fan exhaust port 98 is constrained from flowing to the first fan intake port 86, as indicated by an arrow K.

Figure 12:
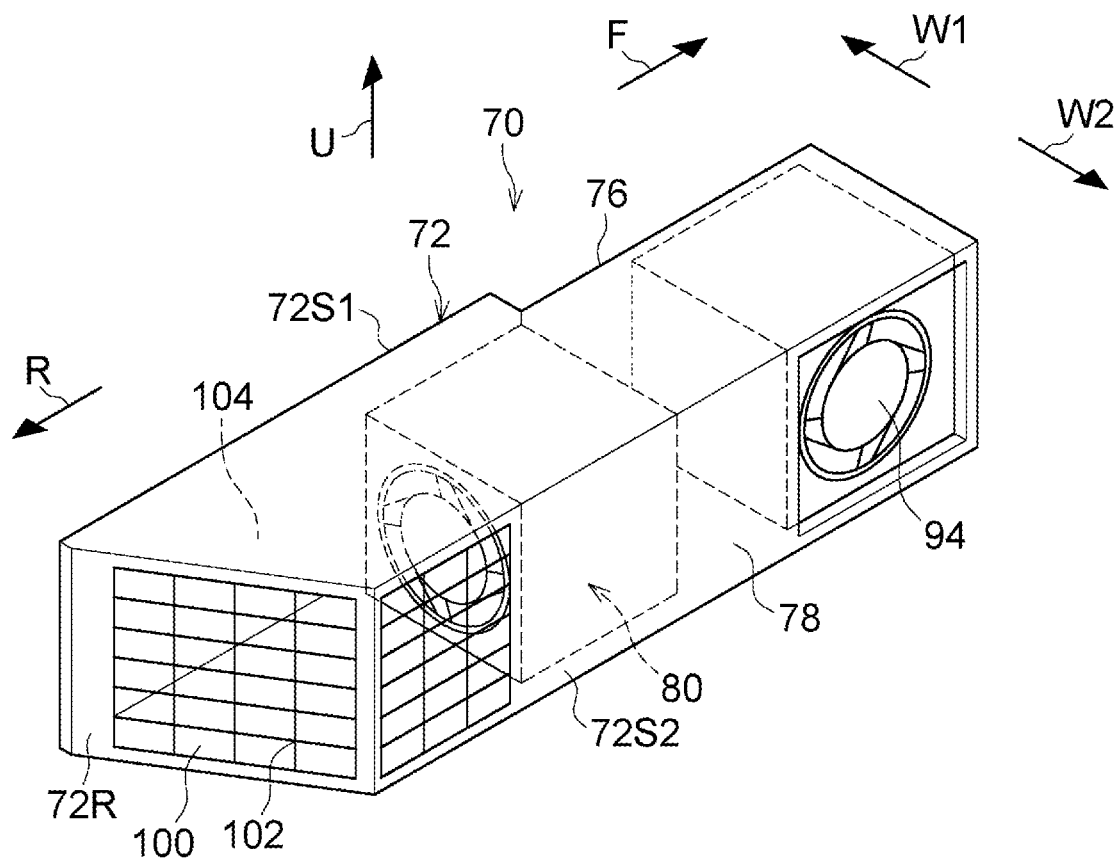
FIG. 12 is a perspective view of the cooling device illustrated in FIG. 4 as viewed from the rear side.

As illustrated in FIGS. 10 and 12, the case rear face 72R of the device case 72 is inclined with respect to the width direction of the device case 72. More specifically, the case rear face 72R is inclined so as to approach the one side (the arrow W1 side) in the width direction of the device case 72 in a direction from a front side toward a rear side of the device case 72. A case exhaust port 100 which exhausts air in the device case 72 to the outside is formed in the case rear face 72R. A foreign object guard 102 which stops a foreign object or the like from entering into the device case 72 is provided at the case exhaust port 100. The foreign object guard 102 is, for example, formed in a lattice shape or formed of perforated metal or the like.

As illustrated in FIG. 10, an exhaust duct chamber 104 which extends from the first fan exhaust port 88 to the case exhaust port 100 is provided in a rear portion of the device case 72. A vent 106 is formed in a case side face 72S2 on the other side in the width direction of the device case 72 in the exhaust duct chamber 104. A foreign object guard 108 is provided at the vent 106. The vent 106 is connected to the case vent 56M (see FIG. 4) on a rear side of the middle unit 40. The foreign object guard 108 is, for example, formed in a lattice shape or formed of perforated metal or the like.

As illustrated in FIG. 4, an exhaust duct 28 which extends to the enclosure exhaust port 16 of the enclosure 12 is formed behind the cooling device 70. The case vent 56R on the rear side of the middle unit 40 is connected to the exhaust duct 28.

Operation of the present embodiment will now be described.

As illustrated in FIG. 3, the first fan unit 80 of the cooling device 70 is arranged with the axial directions of the first axial fans 84 set to the longitudinal direction of the enclosure 12. When the first axial fans 84 are activated, a flow of cooling air from the front side toward the rear side of the longitudinal direction of the enclosure 12 is created. Thus, cooling air V is introduced into the intake-side storage chamber 18F through the enclosure intake port 14 on the front side of the enclosure 12. The cooling air V passes through the plurality of intake-side units 30 and then flows along the front face 20F of the midplane 20 to two sides in the width direction of the enclosure 12. This cools the plurality of intake-side units 30.

The cooling air V flowing along the front face 20F of the midplane 20 to the two sides in the width direction of the enclosure 12 flows into the exhaust-side storage chamber 18R of the enclosure 12 through the ventilation flues 26 on the two sides in the width direction of the midplane 20. As illustrated in FIG. 4, cooling air V1 flowing into the exhaust-side storage chamber 18R passes through the common duct 64 formed on an outer side (the arrow W1 side) in a width direction of the cooling device 70 and flows into the intake duct chamber 74 through the case intake port 76 of the cooling device 70.

The cooling air V1 flowing into the intake duct chamber 74 is sucked into the first fan case 82 through the first fan intake port 86 and is sent out to the exhaust duct chamber 104 through the first fan exhaust port 88. The cooling air V1 sent out to the exhaust duct chamber 104 is exhausted from the case exhaust port 100 of the case rear face 72R to outside the enclosure 12 via the exhaust duct 28 and the enclosure exhaust port 16.

The cooling device 70 includes the second fan unit 90. The second fan unit 90 is stored closer to the case front face 72F (the midplane 20) than the first fan unit 80 in the device case 72. The second fan unit 90 is arranged with the axial directions of the second axial fans 94 set to the width direction of the enclosure 12. When the second axial fans 94 are activated, part (cooling air V2) of the cooling air V passing through the common duct 64 is sucked into the second fan case 92 through the second fan intake port 96 and is sent out to the middle side in the width direction of the enclosure 12 through the second fan exhaust port 98 along the rear face 20R of the midplane 20.

The cooling air V2 sent out to the middle side in the width direction of the enclosure 12 flows into the unit case 42 through the case vent 56F on a front side of the middle unit 40. The cooling air V2 flows to the rear side along the unit case 42 and passes through the main printed circuit board 44 and the plurality of expansion printed circuit boards 50. At this time, the cooling air V2 cools the main printed circuit board 44 and the plurality of expansion printed circuit boards 50.

Cooling air V3 flowing through the unit case 42 flows from the case vent 56M in the intermediate portion in the longitudinal direction of the unit case 42 into the device case 72 via the vent 106 on the rear side of the cooling device 70. The cooling air V3 is exhausted from the case exhaust port 100 of the case rear face 72R to outside the enclosure 12 via the exhaust duct 28 and the enclosure exhaust port 16.

Cooling air V4 flowing through the unit case 42 flows into the exhaust duct 28 through the case vent 56R on the rear side of the unit case 42 and is exhausted to outside the enclosure 12 through the enclosure exhaust port 16.

As described above, in the present embodiment, the second fan unit 90 causes part of the cooling air V flowing from the ventilation flue 26 to the first fan unit 80 to be sent out to the middle side of the exhaust-side storage chamber 18R along the rear face 20R of the midplane 20. This enhances cooling efficiency on the middle side of the exhaust-side storage chamber 18R.

For further clarification of the operation of the present embodiment, an information processing apparatus according to a comparative example will be described.

Figure 13:
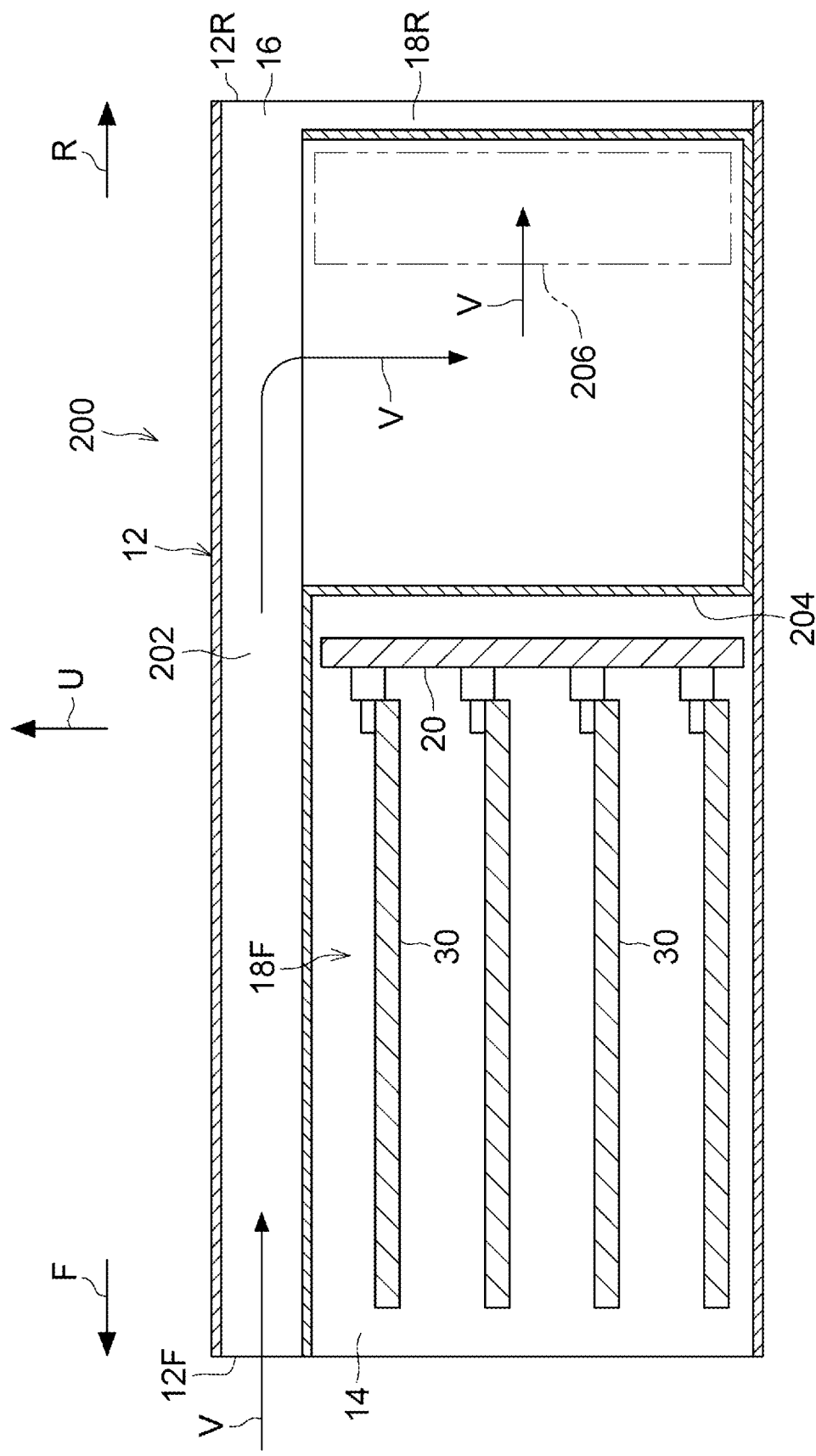
FIG. 13 is a vertical sectional view illustrating an information processing apparatus according to a comparative example.
Figure 14:
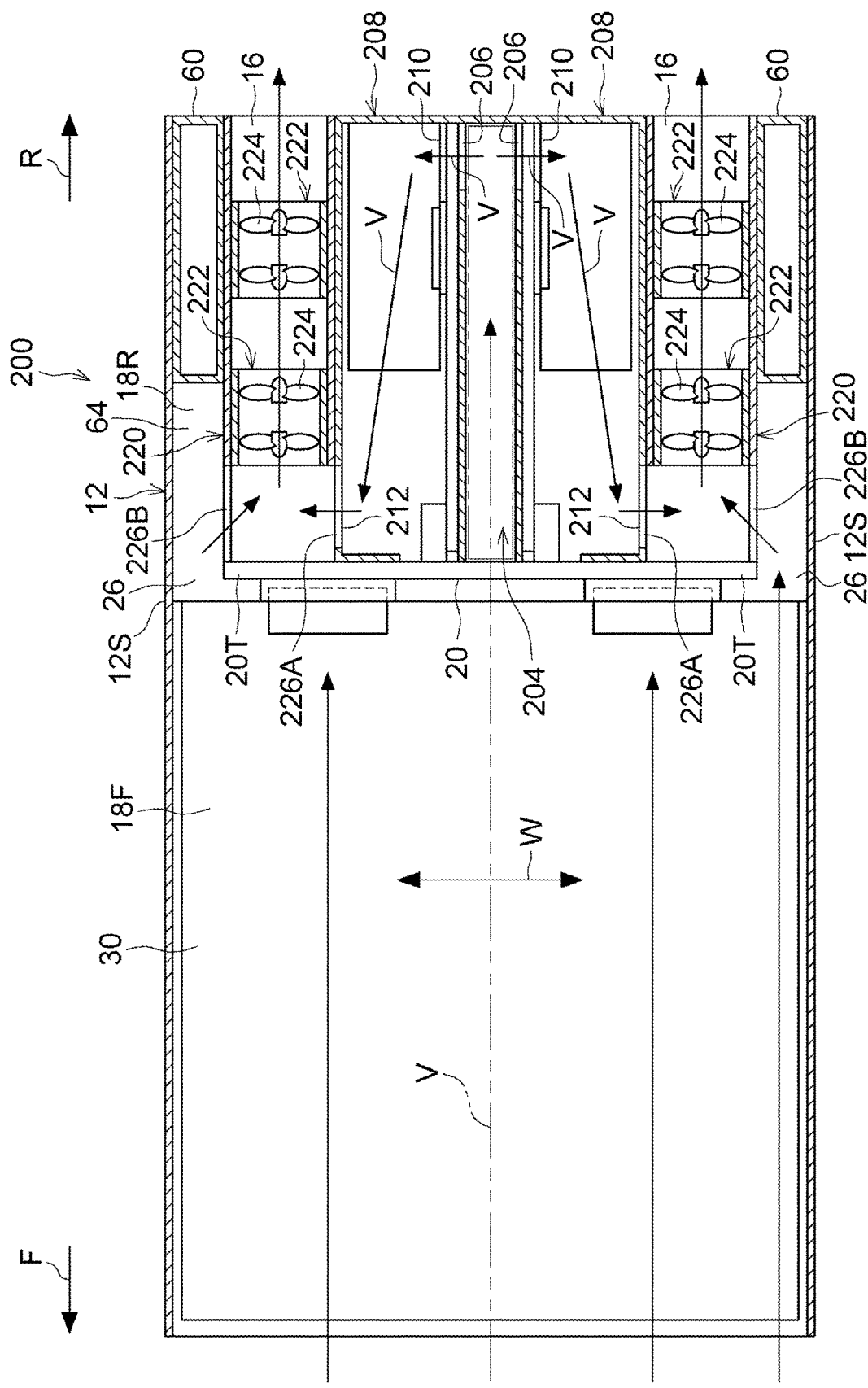
FIG. 14 is a plan sectional view of the information processing apparatus illustrated in FIG. 13.

As illustrated in FIG. 13, in an information processing apparatus 200 according to the comparative example, an upper duct 202 which passes above the midplane 20 and guides air to the exhaust-side storage chamber 18R is formed above the intake-side storage chamber 18F of the enclosure 12. A vertical duct 204 which extends into the exhaust-side storage chamber 18R is connected to a middle portion in a width direction of the upper duct 202. Vents 206 (see FIG. 14) are formed in side faces on two sides in a rear portion of the vertical duct 204. As illustrated in FIG. 14, the vents 206 are connected to vents 210 of middle units 208 which are stored on two sides in a width direction of the vertical duct 204.

A cooling device 220 is stored outside in a width direction of the middle unit 208. The cooling device 220 includes one pair of fan units 222 which are arrayed in the longitudinal direction of the enclosure 12. Each fan unit 222 is arranged with axial directions of axial fans 224 set to a longitudinal direction of the fan unit 222. Case intake ports 226A and 226B are formed in side faces on two sides of the cooling device 220. The case intake port 226A on one side is connected to a vent 212 which is formed in a side face of the middle unit 208. The case intake port 226B on the other side is connected to the ventilation flue 26.

When the one pair of fan units 222 of the cooling device 220 is activated in the information processing apparatus 200 according to the comparative example, cooling air V is introduced from the front face 12F side of the enclosure 12 to the upper duct 202, as illustrated in FIG. 13. As illustrated in FIGS. 13 and 14, the cooling air V is fed from the vent 206 on a rear side of the vertical duct 204 to the vent 210 on a rear side of the middle unit 208.

As illustrated in FIG. 14, the cooling air V fed to the vent 210 on the rear side of the middle unit 208 flows to a front side along the middle unit 208 and is introduced from the vent 212 on the front side of the middle unit 208 to the case intake port 226A of the cooling device 220. The cooling air V introduced to the case intake port 226A then passes through the one pair of fan units 222 and is exhausted to outside the enclosure 12 through the enclosure exhaust port 16.

As described above, since the vertical duct 204 is installed in a middle portion in a width direction of the exhaust-side storage chamber 18R in the information processing apparatus 200 according to the comparative example, a storage space for the middle units 208 of the exhaust-side storage chamber 18R is narrower. That is, the number of middle units 208 stored in the exhaust-side storage chamber 18R is smaller.

In contrast, in the present embodiment, part of the cooling air V (the cooling air V2) flowing from the ventilation flue 26 to the first fan unit 80 is sent out by the second fan unit 90 of the cooling device 70 to the middle side in the width direction of the exhaust-side storage chamber 18R along the rear face 20R of the midplane 20, as illustrated in FIG. 4. This allows enhancement of the cooling efficiency on the middle side of the exhaust-side storage chamber 18R without the vertical duct 204 according to the comparative example. That is, the present embodiment is capable of enhancing the cooling efficiency on the middle side of the exhaust-side storage chamber 18R while securing the number of middle units 40 stored in the exhaust-side storage chamber 18R.

Figure 15:
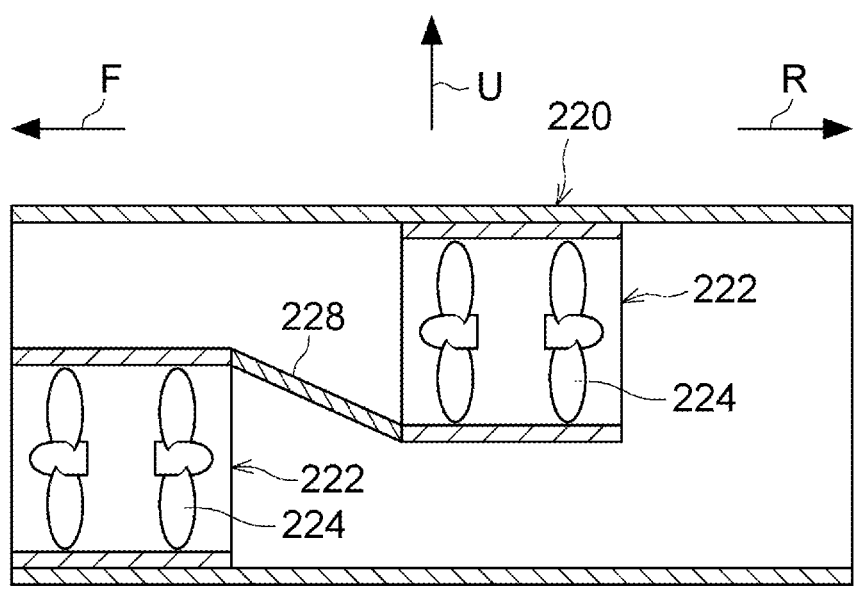
FIG. 15 is a vertical sectional view illustrating a cooling device according to the comparative example.

As illustrated in FIG. 15, in the cooling device 220 according to the comparative example, the one pair of fan units 222 is arranged to be shifted from each other in a height direction (a direction indicated by an arrow U), and an oblique partition plate 228 serves as a partition between the one pair of fan units 222. This enhances cooling efficiency of the one pair of fan units 222. In the cooling device 220 according to the comparative example, however, the one pair of fan units 222 is shifted in the height direction (the direction of the arrow U), which increases height of the cooling device 220.

In contrast, in the cooling device 70 according to the present embodiment, a direction in which the cooling air V1 is sent out in the first fan unit 80 and a direction in which the cooling air V2 is sent out in the second fan unit 90 are different, as illustrated in FIG. 4. There is no reason to shift the first fan unit 80 and the second fan unit 90 in a height direction of the device case 72. Thus, in the present embodiment, the first fan unit 80 and the second fan unit 90 are not shifted in the height direction of the device case 72 and are aligned in the longitudinal direction of the device case 72. With this configuration, the present embodiment allows a reduction in height of the cooling device 70 as compared to the cooling device 220 according to the comparative example.

In the present embodiment, the first fan unit 80 and the second fan unit 90 are not shifted in the width direction of the device case 72 and are aligned in the longitudinal direction of the device case 72. With this configuration, the present embodiment allows a reduction in width of the cooling device 70 as compared to a case where the first fan unit 80 and the second fan unit 90 are arranged to be shifted in the width direction of the device case 72.

As illustrated in FIG. 10, the partition wall portion 78 that serves as the partition between the first fan intake port 86 of the first fan unit 80 and the second fan exhaust port 98 of the second fan unit 90 is provided on the other side in the width direction of the device case 72. With the partition wall portion 78, cooling air sent out from the second fan exhaust port 98 is constrained from flowing to the first fan intake port 86, as indicated by the arrow K. With this configuration, cooling air is efficiently sent out from the second fan unit 90 to the middle side in the width direction of the enclosure 12. This enhances cooling efficiency of the middle unit 40.

The case exhaust port 100, at which the foreign object guard 102 is provided, is formed in the case rear face 72R of the cooling device 70. The case rear face 72R is inclined with respect to the width direction of the device case 72. With this configuration, in the present embodiment, an opening area of the case exhaust port 100 formed in the case rear face 72R is larger than in a case where the case rear face 72R is not inclined with respect to the width direction. The provision of the foreign object guard 102 at the case exhaust port 100 with the larger opening area allows enhancement in an opening ratio of the case rear face 72R.

Additionally, the case rear face 72R is inclined so as to approach the outer side (the arrow W1 side) in the width direction of the enclosure 12 in a direction from the front side to the rear side of the device case 72. With this configuration, the exhaust duct 28 is formed behind the cooling device 70, as illustrated in FIG. 4. The cooling air V4 is exhausted from the case vent 56R on the rear side of the middle unit 40 to the exhaust duct 28. That is, the cooling air V2 flowing through the middle unit 40 is exhausted from the enclosure exhaust port 16 to outside the enclosure 12 via the exhaust duct 28 without passing through the foreign object guard 102 of the cooling device 70. This improves exhaust efficiency of the cooling air V4.

A second embodiment will be next described. Note that same constituent members in the second embodiment as those in the first embodiment are denoted by same reference characters and that a description thereof will be appropriately omitted.

Figure 16:
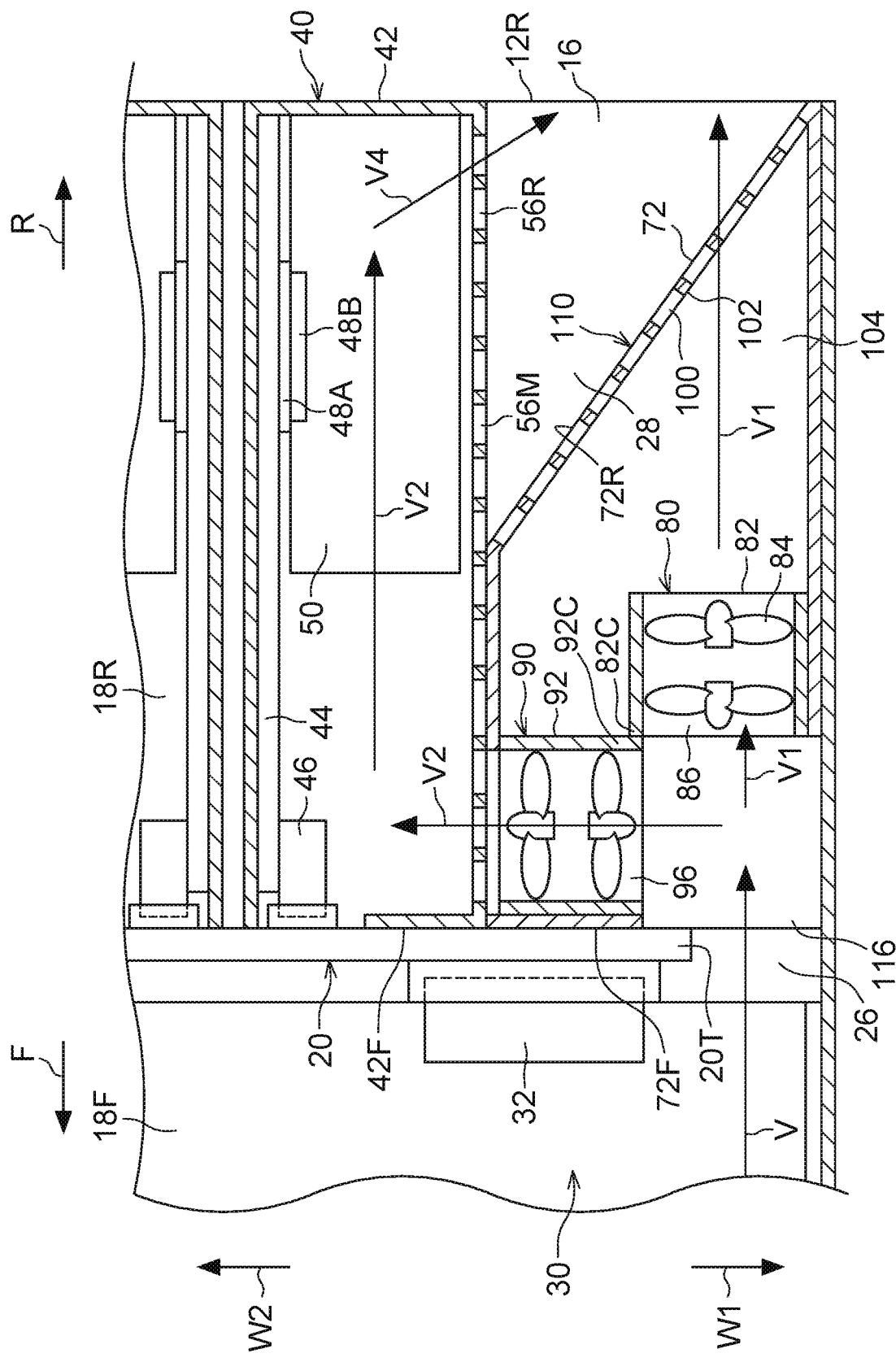
FIG. 16 is a plan sectional view corresponding to FIG. 4 illustrating an information processing apparatus according to a second embodiment.

As illustrated in FIG. 16, in a cooling device 110 according to a second embodiment, a first fan unit 80 is arranged to be shifted to one side in a width direction of a device case 72 (an outer side in a width direction of an enclosure 12) from a second fan unit 90. The first fan unit 80 is arranged farther outside than an end portion 20T of a midplane 20 in the width direction of the enclosure 12 and is arranged to face a ventilation flue 26. A first fan case 82 and a second fan case 92 are arranged while a corner portion 82C on a first fan intake port 86 side and a corner portion 92C on a second fan intake port 96 side are in contact with each other.

A case intake port 116 which introduces air to the first fan intake port 86 of the first fan unit 80 and the second fan intake port 96 of the second fan unit 90 is formed in a case front face 72F of the device case 72. The case intake port 116 is made to face the ventilation flue 26 and the first fan intake port 86 of the first fan unit 80. That is, the ventilation flue 26, the case intake port 116, and the first fan intake port 86 are aligned in a longitudinal direction of the enclosure 12.

Operation of the second embodiment will be described.

As illustrated in FIG. 16, in the cooling device 110, the first fan unit 80 is arranged to be shifted to an outer side (an arrow W1 side) in the width direction of the device case 72 from the second fan unit 90. The corner portion 82C on the first fan intake port 86 side of the first fan unit 80 and the corner portion 92C on the second fan intake port 96 side of the second fan unit 90 are in contact with each other. This allows a reduction in a length in a longitudinal direction of the device case 72. It is thus possible to reduce a size in a longitudinal direction of the cooling device 110.

The case intake port 116 is formed in a site facing the first fan unit 80 of the case front face 72F of the device case 72. That is, the case intake port 116 and the first fan unit 80 are aligned in the longitudinal direction of the device case 72. This improves efficiency of introducing cooling air V from the case intake port 116 to the first fan unit 80.

Additionally, the first fan unit 80 is arranged behind the ventilation flue 26. Air sending force (suction force) of the first fan unit 80 makes the cooling air V easier to introduce from an intake-side storage chamber 18F into an exhaust-side storage chamber 18R via the ventilation flue 26. This improves cooling efficiency of the exhaust-side storage chamber 18R.

Modifications of the above-described first and second embodiments will be described. Note that various modifications will be described below in the context of the first embodiment and that such modifications may be appropriately applied to the second embodiment.

Although the axial direction of the first axial fan 84 is shifted by 90 degrees from that of the second axial fan 94 in the above-described first embodiment, the first embodiment is not limited to this. The axial direction of the first axial fan 84 may cross that of the second axial fan 94 not only at 90 degrees but at any angle within a range which allows exertion of the above-described operations and effects. Although the device case 72 may be omitted from the cooling device 70, and the first fan unit 80 and the second fan unit 90 may be directly stored in (loaded on) the enclosure 12, assembling work is easier in a case where the device case 72 is stored in the enclosure 12 after the fan units 80 and 90, the foreign object guard 102, and the like are assembled to the device case 72.

Although the case rear face 72R of the cooling device 70 is inclined in the above-described first embodiment, the case rear face 72R may not be inclined. In the first embodiment, the foreign object guard 102 is provided at the case exhaust port 100 of the case rear face 72R, and the foreign object guard 102 may be appropriately changed. The numbers and arrangement of the case intake ports 76 and the case exhaust ports 100 in the device case 72 of the cooling device 70 may be appropriately changed.

In the first embodiment, the plurality of intake-side units 30, the plurality of middle units 40, and the plurality of outer units 60 are stored in the enclosure 12. The types, number, and arrangement of units stored in the enclosure 12 may be appropriately changed.

In the first embodiment, the front face 12F side of the enclosure 12 is the one side in the longitudinal direction of the enclosure 12. However, the rear face 12R side of the enclosure 12 may be the one side in the longitudinal direction of the enclosure 12.

Although the respective ventilation flues 26 are formed between the one pair of side wall portions 12S of the enclosure 12 and the end portions 20T on the two sides in the width direction of the midplane 20 in the first embodiment, the first embodiment is not limited to this. For example, respective ventilation flues may be formed between the top wall portion 12U and the bottom wall portion 12L of the enclosure 12 and end portions on two sides in a vertical direction of the midplane 20. In this case, the cooling devices 70 are arranged on two sides in a height direction of the exhaust-side storage chamber 18R while the cooling devices 70 are rotated by 90 degrees. In this state, the second fan unit 90 takes in part of air passing through one side in the height direction of the device case 72 and flowing to the first fan unit 80 and sends out the part of air to the other side (a middle side in the height direction of the enclosure 12) in the height direction of the device case 72. In other words, unlike the information processing apparatus 10 according to the first embodiment, in which the direction of the arrow U illustrated in FIG. 1 is an upper side in the height direction (a direction opposite to a gravity direction), the information processing apparatus 10 may be rotated by 90 degrees, and one side in the width direction (the arrow W) illustrated in FIG. 1 may be transformed to the upper side in the height direction (the direction opposite to the gravity direction).

Embodiments of the technique disclosed herein have been described above. The technique disclosed herein, however, is not limited to the above-described embodiments. The above-described embodiments and various modifications may be appropriately used in combination and may be carried out in various modes without departing from the scope of the technique disclosed herein.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A cooling device comprising:
   a device case that is arranged in an enclosure having a midplane dividing the enclosure into an intake-side storage chamber and an exhaust-side storage chamber, with a case front face of the device case facing, in the exhaust-side storage chamber a rear face of the midplane and a case rear face of the device case facing a rear face of the enclosure;
   a first fan unit including a first fan case having a first axial fan that generates a flow of air from a ventilation flue formed between an end portion of the midplane and a side wall of the enclosure to the case rear face of the device case; and
   a second fan unit adjacent to the midplane and including a second fan case having a second axial fan that takes in part of the flow of air passing through the ventilation flue and sends out the part of the flow of air to another side of the device case opposite to the side wall of the enclosure,
   the first axial fan having an axial direction set to a longitudinal direction of the device case, and the first fan case having a first fan intake port facing the midplane and a first fan exhaust port facing the case rear face, and
   the second axial fan having an axial direction set to the width direction of the device case, and the second fan case having a second fan intake port facing the side wall of the enclosure on one side in the width direction of the device case, and a second fan exhaust port facing another the other side in the width direction of the device case,
   the first fan case is aligned with the second fan case in the longitudinal direction of the device case and is spaced apart from the second fan case,
   a partition wall portion that serves as a partition between the first fan intake port and the second fan exhaust port, the partition wall portion blocks airflow exiting the second fan exhaust port from flowing into the first fan intake port.

2. The cooling device according to claim 1, wherein a case intake port that introduces air to the first fan unit and the second fan unit is formed facing the side wall of the enclosure on the one side in the width direction of the device case.

3. The cooling device according to claim 1, wherein the first fan intake port faces a side wall of the second fan case and the first fan case is arranged closer to the case rear face.

4. The cooling device according to claim 3, wherein a case intake port that introduces air to the first fan unit and the second fan unit is formed facing the case front face.

5. The cooling device according to claim 1, wherein a width of the first fan case in the width direction of the device case and a length of the second fan case in the width direction of the device case are equal with each other.

6. The cooling device according to claim 1, wherein
   the case rear face is inclined with respect to the width direction of the device case, and
   a case exhaust port that is provided with a foreign object guard is formed in the case rear face.

7. The cooling device according to claim 6, wherein the case rear face is inclined so as to approach the one side in the width direction of the device case in a direction from a front side toward a rear side of the device case.

8. The cooling device according to claim 1, wherein
   the device case includes an exhaust duct chamber that extends from the first fan unit to the case rear face, and
   a vent is formed in a case side face on the other side in the width direction of the device case in the exhaust duct chamber.

9. The cooling device according to claim 1, wherein the first fan unit and second fan unit change direction of the flow of air entering and passing through the ventilation flue to the respective axial directions.

10. The cooling device according to claim 1, wherein a center of the second fan case is aligned with a center of the first fan case in the longitudinal direction.

11. The cooling device according to claim 1, wherein the second fan unit directs a flow of air away from the side wall of the enclosure and into an exhaust duct chamber that passes the flow to the case rear face that is inclined with respect to the width direction of the cooling device such that exhaust from the first fan unit and the second fan unit exit the device case at a same device exhaust port.

12. The cooling device according to claim 11, wherein the exhaust duct chamber includes a chamber rear face on which electrical connections are arranged that are adjacent to the same device exhaust port.

13. The cooling device according to claim 1, wherein alignment of the first fan case and the second fan case in the longitudinal direction of the device case provides cooling with the first axial fan and the second axial fan without requiring an increased width of the device case in the width direction to accommodate the first fan case and the second fan case.

14. An information processing apparatus comprising:
an enclosure that has an enclosure intake port on one side in a longitudinal direction and an enclosure exhaust port on another side in the longitudinal direction;
a midplane that is provided in the enclosure, divides the enclosure into an intake-side storage chamber on a side with the enclosure intake port and an exhaust-side storage chamber on a side with the enclosure exhaust port, and forms a ventilation flue connecting the intake-side storage chamber and the exhaust-side storage chamber between the midplane and the enclosure;
a first fan unit that is arranged in the exhaust-side storage chamber and introduces air from the enclosure intake port to the exhaust-side storage chamber via the ventilation flue;
a second fan unit that is arranged closer to the midplane than the first fan unit in the exhaust-side storage chamber, and takes in part of air flowing from the ventilation flue to the first fan unit and sends out the part of the air to a middle side of the exhaust-side storage chamber along the midplane; and
a device case that is arranged with a case front face facing the midplane and stores the first fan unit and the second fan unit,
the first fan unit includes a first axial fan having an axial direction set to a longitudinal direction of the device case, and a first fan case having a first fan intake port on a side with the case front face and a first fan exhaust port on a side with a case rear face of the device case and storing the first axial fan inside, and
the second fan unit includes a second axial fan having an axial direction set to a width direction of the device case, and a second fan case having a second fan intake port on one side in the width direction of the device case and a second fan exhaust port on the other side in the width direction of the device case and storing the second axial fan inside,
the first fan unit is aligned with the second fan unit in the longitudinal direction of the device case and is spaced apart from the second fan unit,
a partition wall portion that serves as a partition between the first fan intake port and the second fan exhaust port is provided on the other side in the width direction of the device case, the partition wall portion blocks airflow exiting the second fan exhaust port from flowing into the first fan intake port.

15. The information processing apparatus according to claim 14, wherein a case intake port that introduces air to the first fan unit and the second fan unit is formed facing the side wall of the enclosure on the one side in the width direction of the device case.

16. The information processing apparatus according to claim 14, wherein the first fan intake port faces a side wall of the second fan case and the first fan case is arranged closer to the case rear face.

17. The information processing apparatus according to claim 16, wherein a case intake port that introduces air to the first fan unit and the second fan unit is formed facing the case front face.

18. The information processing apparatus according to claim 14, wherein
the device case includes an exhaust duct chamber that extends from the first fan unit to the case rear face, and a vent is formed in a case side face on the other side in the width direction of the device case in the exhaust duct chamber.

19. A cooling device comprising:
a device case that is arranged in an enclosure having an enclosure intake port on a front face of the enclosure and an enclosure exhaust port on a rear face on the enclosure opposite the front face and a midplane dividing the enclosure into an intake-side storage chamber and an exhaust-side storage chamber, and forming a ventilation flue connecting the intake-side storage chamber and the exhaust-side storage chamber between an end portion of the midplane and a side wall of the enclosure, the intake-side storage chamber stores a first unit to be cooled by a flow of air passing through the ventilation flue, the exhaust-side storage chamber stores a second unit to be cooled by a part of the flow of air passing through the ventilation flue, and the device case is adjacent to the second unit with a case front face of the device case facing the midplane;
a first fan unit that is stored in the device case and generates the flow of air by introducing air from the enclosure intake port to the enclosure exhaust port via the ventilation flue, and a case rear face of the device case; and
a second fan unit that is stored closer to the case front face than the first fan unit in the device case, and takes in part of the flow of air passing through the ventilation flue and sends out the part of the flow of air to the second unit,
the first fan unit includes a first axial fan having an axial direction set to a longitudinal direction of the device case, and a first fan case having a first fan intake port directed to the case front face and a first fan exhaust port directed to the case rear face and storing the first axial fan inside, and
the second fan unit includes a second axial fan having an axial direction that is 90 degree shifted from the axial direction of the first axial fan, and a second fan case having a second fan intake port directed to the side wall and a second fan exhaust port directed to the second unit,
the first fan unit is aligned with the second fan unit in the longitudinal direction of the device case and is spaced apart from the second fan unit,
a partition wall portion that serves as a partition between the first fan intake port and the second fan exhaust port is provided, the partition wall portion blocks airflow exiting the second fan exhaust port from flowing into the first fan intake port, and
the case rear face is provided with a first foreign object guard, and inclined with respect to a width direction of the device case such that an end portion of the case rear face facing to the second unit is in between the first fan unit and the exhaust port of the enclosure while an opposite end portion of the case rear face is close to the exhaust port of the enclosure, and an exhaust duct is formed between the case rear face and a side of the second unit, the side of the second unit is provided with a second foreign object guard through which the part of the flow of air is exhausted to the enclosure exhaust port via the exhaust duct.

* * * * *